(12) United States Patent
Bingham (10) Patent No.: US 9,118,304 B2
(45) Date of Patent: Aug. 25, 2015

(54) DYNAMIC TUNING IN DENSE ARRAYS OF ELECTRICALLY SMALL ELEMENTS

(71) Applicant: Aereo, Inc., Long Island City, NY (US)

(72) Inventor: James Alan Bingham, Westerville, OH (US)

(73) Assignee: RPX Corporation, San Francisco, CA (US)

( * ) Notice: Subject to any disclaimer, the term of this patent is extended or adjusted under 35 U.S.C. 154(b) by 0 days.

(21) Appl. No.: 13/755,666

(22) Filed: Jan. 31, 2013

(65) Prior Publication Data

US 2014/0038535 A1 Feb. 6, 2014

Related U.S. Application Data

(60) Provisional application No. 61/652,694, filed on May 29, 2012.

(51) Int. Cl.
| | |
|---|---|
| *H04B 1/18* | (2006.01) |
| *H04B 1/06* | (2006.01) |
| *H04B 7/00* | (2006.01) |
| *H03J 5/00* | (2006.01) |
| *H04B 1/16* | (2006.01) |
| *H04B 7/08* | (2006.01) |

(52) U.S. Cl.
CPC ... *H03J 5/00* (2013.01); *H04B 1/16* (2013.01); *H04B 7/082* (2013.01); *H03J 2200/06* (2013.01)

(58) Field of Classification Search
USPC .............. 455/3.01, 3.03, 150.1, 193.1, 193.3, 455/272, 277.1, 277.2; 725/86, 100, 139
See application file for complete search history.

(56) References Cited

U.S. PATENT DOCUMENTS

| | | | |
|---|---|---|---|
| 2008/0267108 A1 | 10/2008 | Zhang et al. | |
| 2009/0143035 A1* | 6/2009 | Jaisimha et al. | 455/161.3 |
| 2010/0144295 A1* | 6/2010 | Kroeger et al. | 455/193.1 |
| 2012/0129479 A1* | 5/2012 | Kanojia et al. | 455/230 |
| 2012/0131621 A1* | 5/2012 | Kanojia et al. | 725/93 |
| 2013/0095868 A1* | 4/2013 | Salsbury et al. | 455/500 |
| 2013/0207870 A1 | 8/2013 | Lipowski et al. | |
| 2013/0236158 A1* | 9/2013 | Lynch et al. | 386/231 |
| 2014/0011517 A1* | 1/2014 | Lin et al. | 455/456.1 |

* cited by examiner

*Primary Examiner* — Nguyen Vo
(74) *Attorney, Agent, or Firm* — Houston & Associates, LLP (57) ABSTRACT

The purpose of dynamically tuning in dense arrays is to improve power received and signal quality. In traditional phased array the inherent design procedure is to design for good matching over the frequency and scan angle of operation. Typically this is done in the overall design based on a priori knowledge of the frequency, relative phasing and amplitude distribution of all the elements. With this a priori knowledge the design can be done based on known mutual coupling.

18 Claims, 8 Drawing Sheets

DYNAMIC TUNING IN DENSE ARRAYS OF ELECTRICALLY SMALL ELEMENTS

RELATED APPLICATIONS

This application claims the benefit under 35 U.S.C. §119 (e) of U.S. Provisional Application No. 61/652,694, filed on May 29, 2012, which is incorporated herein by reference in its entirety.

BACKGROUND OF THE INVENTION

Television programming is broadcast by broadcasting entities on different television channels. Some examples of well-known television networks in the United States include ABC, CBS, FOX, NBC, and PBS.

In general, the channels map to frequency ranges within the radio frequency (RF) spectrum. For example, in the United States channel 2 is broadcast between 54-60 MegaHertz (MHz), channel 3 is broadcast between 60-66 MHz, and channel 4 is broadcast between 66-72 MHz, to list a few examples.

Recently, systems having arrays of small RF antenna elements have been deployed for capturing the over the air content. The systems then stream the captured content to users via public networks, such as the Internet, and/or private networks. An example of a system for capturing and streaming over the air content to users via the Internet is described in, "System and Method for Providing Network Access to Antenna Feeds" by Kanojia et al., filed Nov. 17, 2011, U.S. patent application Ser. No. 13/299,186, (U.S. Pat. Pub. No. US 2012/0127374 A1), which is incorporated herein by reference in its entirety.

In these capture systems, each user is assigned their own antenna element. Thus, the systems generally include arrays having large numbers of physically small antenna elements. In order to maximize the number of antenna elements at installation locations, the antenna elements are implemented on antenna array cards in two dimensional arrays and are preferably deployed in three dimensional arrays. Generally, the three dimensional arrays are created by stacking the antenna array cards.

SUMMARY OF THE INVENTION

Because the antenna elements are physically small and the arrays are preferably dense, the capture systems should be located physically near to television transmitters of the broadcasting entities. This ensures a strong signal and compensates for the low gain characteristics of the physically small antenna elements and any other attenuation effects due to the density of the arrays. Additionally, in arrays where there is limited (or no) a priori knowledge of frequency, phasing, or amplitude, the design and configuration of the array is unable to account for coupling (or interference) between antenna elements.

Unlike antenna elements in a phased array, it is not desirable to have multiple antenna elements competing over the same incident power. To minimize coupling between antenna elements, users are not assigned randomly to antenna elements within the array. Instead, they are selectively assigned to antenna elements based on which channels are requested by the users and to which channels the other antenna elements are already tuned.

Despite attempts to minimize coupling between antenna elements, at least some coupling is unavoidable due to the array density. The present system is directed to dynamically tuning antenna elements to enhance reception and reduce coupling of the antenna elements in the array. By implementing tuning controls, the antenna elements can be tuned based on measured parameters to reduce destructive effects due to coupling between the antenna elements.

In general, according to one aspect, the invention features a method for dynamically tuning antenna elements. The method comprises receiving requests to capture over the air broadcasts, selecting an antenna element from a group of available antenna elements to capture the requested over the air broadcasts, and dynamically tuning the selected antenna element to enhance reception of the over the air broadcasts.

In embodiments, the method further comprises measuring parameters of the selected antenna element to determine how to optimize the selected antenna element. The parameters typically include received power, signal quality, temperature of the antenna element, and/or automatic gain control, which can be prioritized. Preferably the method further comprises adjusting a control voltage of a varactor diode pair based on the measured parameters to tune the selected antenna element.

In examples, an optimization algorithm is used to yield a divergence of the measured parameters. The optimization algorithm can be a conjugate gradient algorithm, mapping techniques, or ad hoc algorithm.

Impedances matching is also preferably employed between the antenna elements and tuners with impedance matching circuits.

In some cases parameter limits are applied to prevent dynamically tuning antenna elements above a distance threshold or above a frequency threshold.

In general, according to another aspect, the invention features an antenna element tuning system, comprising a web server that receives requests to capture over the air broadcasts from broadcasting entities and an antenna controller that selects an antenna element from a group of available antenna elements to capture the requested over the air broadcasts and then dynamically tunes the antenna element to enhance reception of the over the air broadcasts.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms of nouns and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Figure 1:
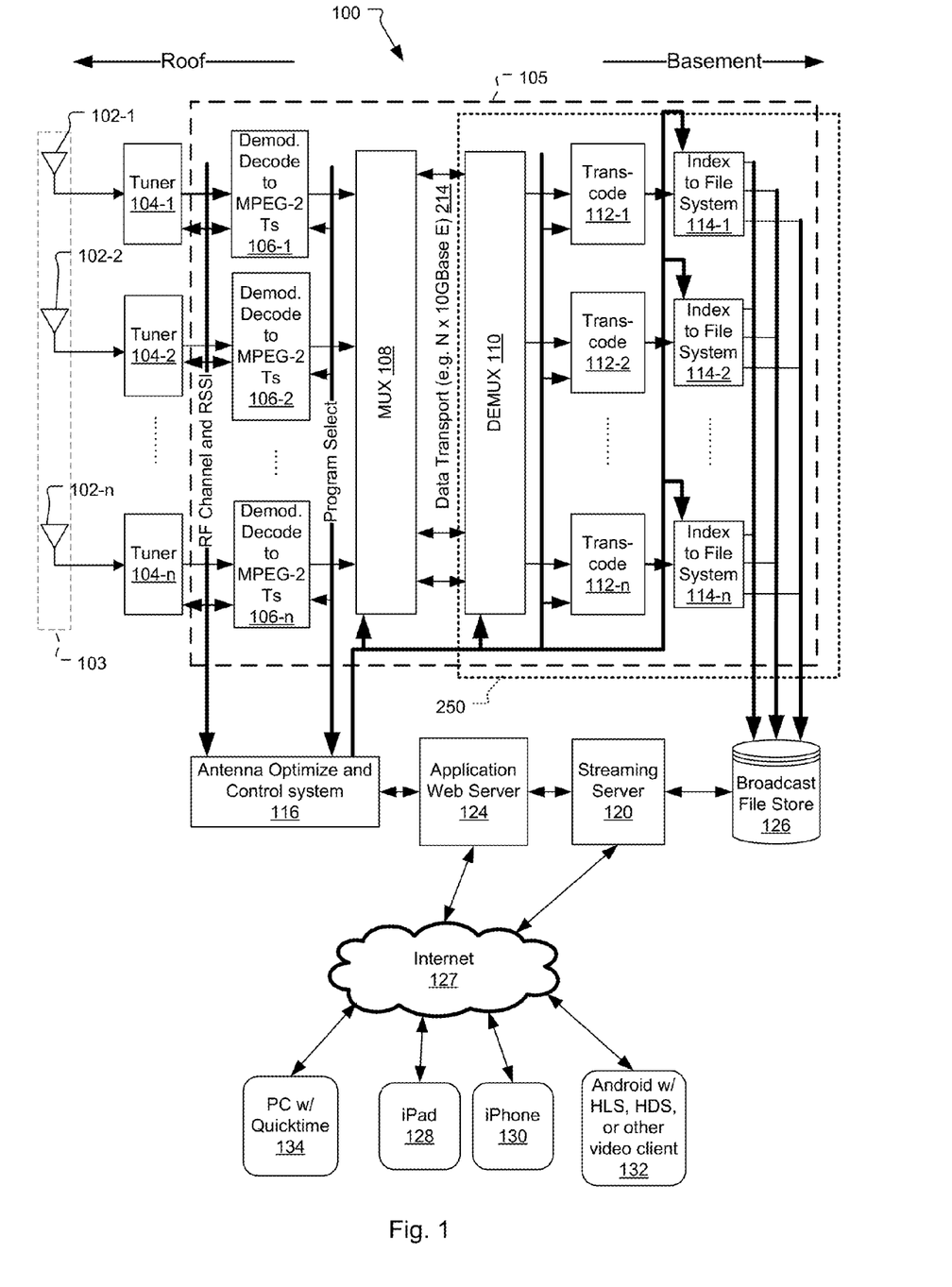
FIG. 1 is a block diagram illustrating a system for the capture and distribution of broadcast television programs.

FIG. 1 shows a capture system 100 that enables individual users to receive terrestrial television content transmissions captured by antenna elements 102 and streamed to the users. The system 100 allows each user to separately access the feed from a separate antenna element for recording or live streaming of content transmissions.

In a typical implementation, users access the system 100 via packet network(s), which can be private and/or public, such as the Internet 127, with client devices 128, 130, 132, 134. In one example, the client device is a personal computer 134 that accesses the system 100 via a browser. In other examples, the system 100 is accessed by mobile devices such as a tablet or slate computing device, e.g., iPad mobile computing device, or a mobile phone, e.g., iPhone mobile computing device or mobile computing devices running the Android operating system by Google, Inc. Other examples of client devices are televisions that have network interfaces and browsing capabilities. Additionally, many modern game consoles and some televisions also have the ability to run third-party software and provide web browsing capabilities that can be employed to access the video from the system 100 over a network connection.

The broadcast content is often displayed using HTML-5 or with a media player executing on the client devices such as QuickTime by Apple Corporation, Windows Media Player by Microsoft Corporation, iTunes by Apple Corporation, or Winamp Media Player by Nullsoft Inc., to list a few examples that are currently common.

An application web server (or application server) 124 manages requests or commands from the client devices 128, 130, 132, 134. The application server 124 enables the users on the client devices 128, 130, 132, 134 to select whether they want to access previously recorded content transmission, set up recordings of future content transmissions, or watch live broadcast television programs in real time. In some examples, the system 100 also enables users to access and/or record radio (audio-only) broadcasts.

If the users request to watch previously recorded content transmissions, then the application server 124 sends the request of the user to a streaming server 120, which retrieves each users' individual copy of the previously recorded content transmission from a broadcast file store (or file store) 126, if that is where it is resident, and streams the content to the client device 128, 130, 132, 134 from which the request originated. If the users request to set up future recordings of content transmissions such as television programs, the application server 124 communicates with an antenna optimization and control system 116 to configure broadcast capture resources to capture and record the desired content transmissions by reserving antenna and encoding resources for the time and date of the future recording. If the users request to watch live broadcast television programs in real time, the antenna optimization and control system 116 identifies antenna resources available for immediate assignment.

In current embodiments, streaming content is temporarily stored or buffered in the streaming server 120 and/or the broadcast file store 126 prior to playback and streaming to the users whether for live streaming or future recording. This buffering allows users to pause, rewind, and replay parts of the television program.

In one implementation, the antenna optimization and control system 116 maintains the assignment of an antenna element 102 to the user throughout any scheduled television program or continuous usage until such time as the user releases the antenna element by closing the session or by the expiration of a predetermined time period as maintained by a timer implemented in the antenna optimization and control system 116. An alternative implementation would have each antenna element 102 assigned to a particular user for the user's sole usage.

Figure 2:
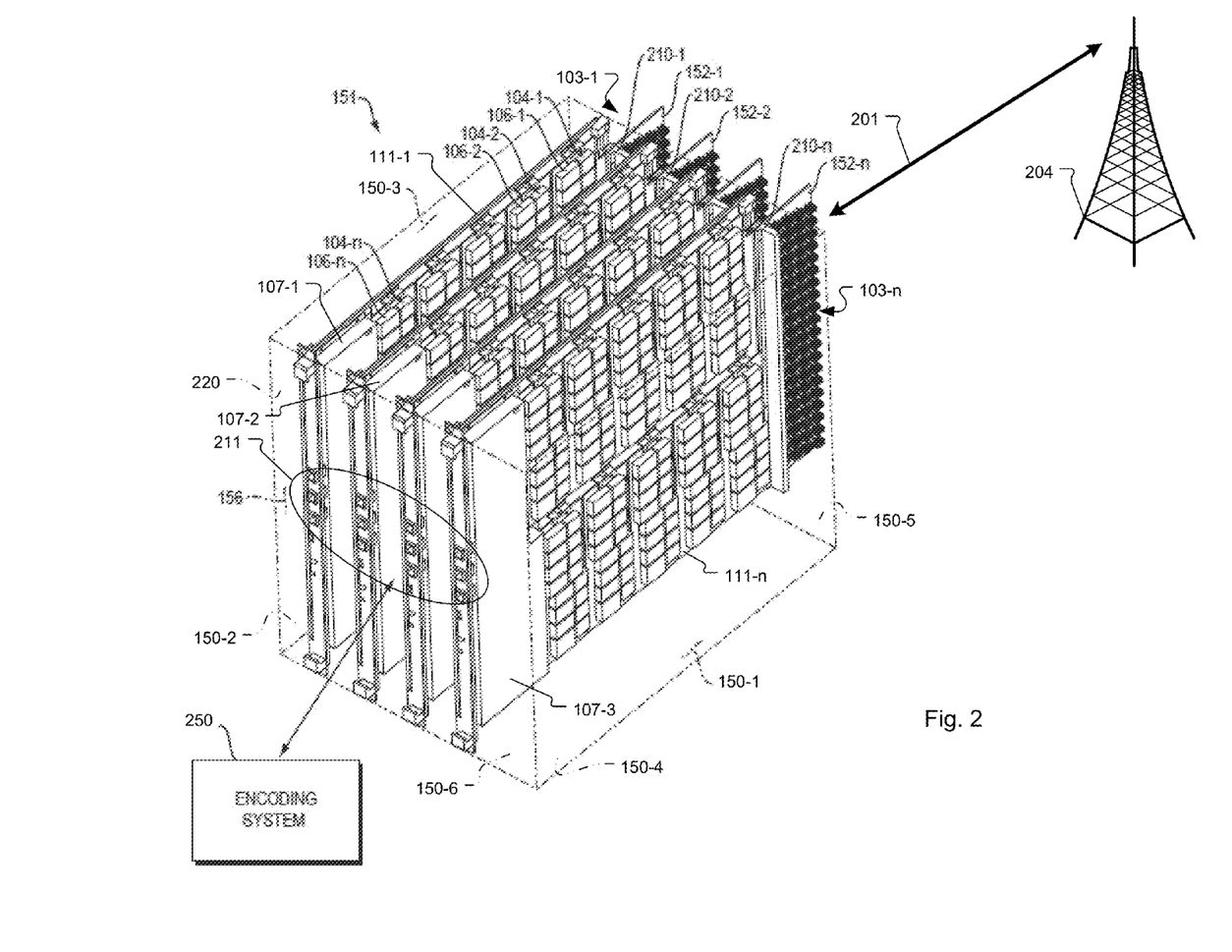
FIG. 2 is a schematic perspective view of a three dimensional antenna array including a card cage structure shown in phantom, which functions as an enclosure for the antenna array cards.

The broadcast capture portion of the system 100 includes an array 103 of the antenna elements 102-1, 102-2 . . . 102-$n$. Each of these antenna elements 102-1, 102-2 . . . 102-$n$ is a separate antenna element that is capable of capturing different terrestrial television content broadcasts and, through a digitization and encoding pipeline, separately process those broadcasts for storage and/or live streaming to the client devices 128, 130, 132, 134. This configuration allows the simultaneous recording of over the air broadcasts from different broadcasting entities for each of the users. In the illustrated example, only one array of antenna elements 103 is shown. In a typical implementation, however, multiple two dimensional arrays are used, and in some examples, the arrays are organized into groups of three dimensional arrays. An example of a three dimensional array (which includes arrays 103-1 to 103-$n$) is shown in FIG. 2.

The antenna optimization and control system 116 determines which antenna elements 102-1 to 102-$n$ within the antenna array 103 are available and optimized to receive the particular over the air broadcast content transmissions requested by the users. In a preferred embodiment, the antenna optimization and control system 116 implements an assignment algorithm that optimally assigns users requests to antenna elements 102-1 to 102-n to minimize the amount of coupling between the antenna elements 102-1 to 102-n.

In one implementation, determination of optimized antennas is accomplished by comparing received signal strength indicator (RSSI) values of different antenna elements. RSSI is a measurement of the power of a received or incoming radio frequency signal. Thus, the higher the RSSI value, the stronger the received signal.

In an alternative embodiment, the antenna optimization and control system 116 determines the best available antenna using Modulation Error Ratio (MER). Modulation Error Ratio is used to measure the performance of digital transmitters (or receivers) that are using digital modulation. In short, the antenna element that has the best MER for the desired channel is selected and assigned to receive that channel.

In the illustrated embodiment, the assignment algorithm avoids assigning user requests to antenna elements if the assigned antenna elements will be blocked by other antenna elements tuned to the same or similar channel. Additionally, if the assigned antenna elements must be tuned to the same or similar channel as other adjacent antenna elements, then the antenna optimization and control system 116 assigns user requests to antenna elements that traditionally have had lower coupling when assigned near other antenna elements tuned to the same or similar channel.

In scenarios where coupling cannot be avoided, the antenna optimization and control system 116 dynamically tunes the antenna elements 102-1 to 102-n based on measured parameters. In a typical implementation, the antenna optimization and control system 116 adjust a control voltage sent to varactor diode pairs to dynamically tune the antenna elements 102-1 to 102-n based on measured parameters of the antenna elements.

In still other alternative embodiments, other methods to minimize destructive coupling effects, which minimize least mean squared error of the metric being optimized, could also be implemented.

After identifying antenna elements with adequately minimized coupling, the antenna optimization and control system 116 assigns the user requests to the antenna elements 102-1 to 102-n. The antenna optimization and control system 116 then signals corresponding RF tuners 104-1 to 104-n to tune the assigned antenna elements to receive the requested broadcasts.

The received broadcasts from each of the antenna elements 102-1 to 102-n and their associated tuners 104-1 to 104-n are transmitted to an encoding system 105 as content transmissions. The encoding system 105 is comprised of encoding components that create parallel processing pipelines for each allocated antenna 102-1 to 102-n and tuner 104-1 to 104-n pair.

The encoding system 105 demodulates and decodes the separate content transmissions from the antennas 102-1 to 102-n and tuners 104-1 to 104-n into MPEG-2 format using an array of ATSC (Advanced Television Systems Committee) decoders 106-1 to 106-n assigned to each of the processing pipelines. The content transmissions are decoded to MPEG-2 content transmission data because it is currently a standard format for the coding of moving pictures and associated audio information.

The content transmission data from the ATSC decoders 106-1 to 106-n are sent to a multiplexer 108. The content transmissions are then transmitted across an antenna transport interconnect to a demultiplexer switch 110. In a preferred embodiment, the antenna transport interconnect is an nx10 GbE optical data transport layer.

The content transmission data of each of the antenna processing pipelines are then transcoded into a format that is more efficient for storage and streaming. In the current implementation, the transcode to the MPEG-4 (also known as H.264) format is effected by an array of transcoders 112-1 to 112-n. Typically, multiple transcoding threads run on a single signal processing core, SOC (system on a chip), FPGA or ASIC type device.

The content transmission data are transcoded to MPEG-4 format to reduce the bitrates and the sizes of the data footprints. As a consequence, the conversion of the content transmission data to MPEG-4 encoding will reduce the picture quality or resolution of the content, but this reduction is generally not enough to be noticeable for the average user on a typical reduced resolution video display device. The reduced size of the content transmissions will make the content transmissions easier to store, transfer, and stream to the user devices. Similarly, audio is transcoded to AAC in the current embodiment, which is known to be highly efficient.

In one embodiment, the transcoded content transmission data are sent to a packetizers and indexers 114-1, 114-2 . . . 114-n of the pipelines, which packetize the data. In the current embodiment, the packet protocol is UDP (user datagram protocol), which is a stateless, streaming protocol.

Also, in this process, time index information is added to the content transmissions. The content data are then transferred to the broadcast file store 126 for storage to the file system, which is used to store and/or buffer the content transmissions as content data for the various content transmission, e.g., television programs, being captured by the users.

In typical embodiments, the content data are streamed to the users with HTTP Live Streaming or HTTP Dynamic Streaming. These are streaming protocols that are dependent upon the client device. HTTP Live Streaming is a HTTP-based media streaming communications protocol implemented by Apple Inc. as part of its QuickTime X and iPhone software systems. The stream is divided into a sequence of HTTP-based file downloads. HDS over TCP/IP is another option. This is an adaptive streaming communications protocol by Adobe System Inc. HDS dynamically switches between streams of different quality based on the network bandwidth and the computing device's resources. Generally, the content data are streamed using Hypertext Transfer Protocol (HTTP) or Hypertext Transfer Protocol Secure (or HTTPS). HTTPS combines HTTP with the security of Transport Layer Security/Secure Sockets Layer (or TLS/SSL). TLS/SSL are security protocols that provide encryption of data transferred over the Internet.

FIG. 2 is a schematic perspective view of an exemplary card cage 151, which is shown in phantom. The card cage 151 functions as an enclosure to house antenna array cards 152-1 to 152-n to create a three-dimensional array of antenna elements. The three dimensional array is comprised of multiple two dimensional antenna arrays 103-1 to 103-n.

The sides 150-1, 150-2, top 150-3, bottom 150-4, front portions 150-5, and rear 150-6 walls of the card cage 151 are fabricated from a conductive material to maximize Faraday shielding of the antenna elements from the active electronics. The front wall 150-5 of the card cage provides an open port as the boresight 201 of the antenna arrays 103-1 to 103-n and faces a television transmitter 204 of the broadcasting entity. Some examples of broadcasting entities include The American Broadcasting Company (ABC), The National Broadcasting Company (NBC), CBS broadcasting corporation (CBS), and The Public Broadcasting Service (PBS). The rear wall 150-6 of the card cage 151 includes data transport interfaces 211 that connect the antenna array cards 152-1 to 152-*n* to the remainder of the encoding system 250, which includes the transcoders 112-1 to 112-*n*, packetizers and indexers 114-1 to 114-*n*, and broadcast file store 126 (shown in FIG. 1). The transcoders 112-1 to 112-*n*, packetizers and indexers 114-1 to 114-*n*, and file store 126 are preferably located in a secure location such as a ground-level but or the basement of a building, which provides protection from weather and elements and generally has better control over the ambient environment.

In a current embodiment, each antenna array 103-1 to 103-*n* includes 80 antenna elements that are located outside the Faraday shielding of the card cage 151. Typically, the antenna elements are dual loop antennas. Thus, in the current embodiment with 80 antenna elements, there are 160 loop antennas. In alternative embodiments, as many as 320 antenna elements (640 loops antennas) or possibly 640 antenna elements (1280 loops antennas) are installed on each antenna array card 152-1 to 152-*n*. Each antenna is approximately 0.5 inches in height, 0.5 inches wide, or about 1 centimeter (cm) by 1 cm, and has a thickness of approximately 0.030 inches, or about a 1 millimeter (mm). In terms of the antenna elements, when configured as a square loop, the 3 sided length is preferably less than 1.7 inches (4.3 cm), for a total length of all 4 sides being 2.3 inches, (5.8 cm).

Air dams 210-1 to 210-*n* divide the antenna arrays 103-1 to 103-*n* from the tuner demodulator sections 111-1 to 111-*n*. The air dams 210-1 to 210-*n* act to block the airflow for the antenna array cards 152-1 to 152-*n* and fill in the gap between the cards such that the air dam of each card engages the backside of its adjacent card. Additionally, the air dams 210-1 to 210-*n* also act as part of the Faraday shields to reduce electromagnetic interference (EMI).

Typically, the antenna array cards 152-1 to 152-*n* are orientated vertically, with the antenna elements horizontal to create a horizontally polarized (Electric Field) half omnidirectional antenna array. Additionally, the antenna elements protrude out of the front of card cage 208 to further help reduce interference between the components (e.g., tuner and demodulators) and the antenna arrays 103-1 to 103-*n*.

Alternatively, if over the air content from the broadcasters has a vertical polarization, which occurs in some locales, then orientation of the antenna array cards 152-1 to 152-*n* and antennas should be changed accordingly. The illustrated example shows the orientation of the antennas for broadcasters with horizontal polarization.

Figure 3A:
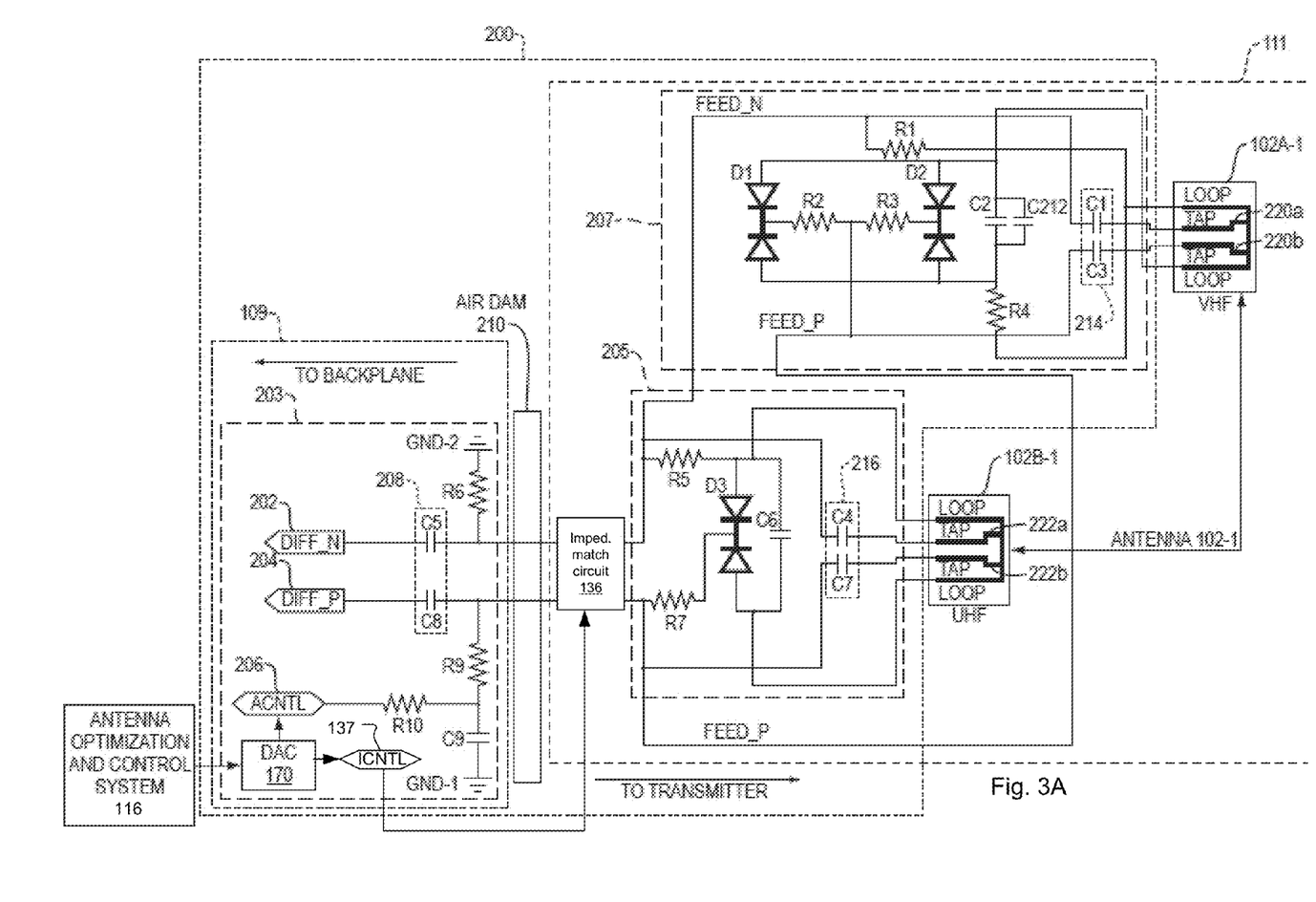
FIG. 3A is a circuit diagram of an antenna and tuning feed network for an antenna system.

FIG. 3A is a circuit diagram of a multi-band antenna 102-1 and tuning feed network 200 for an antenna system 100, which has been constructed according to the principles of the present invention.

In the illustrated circuit diagram, a multi-band antenna element 102-1 is shown as a dual band antenna. In the illustrated example, the antenna element 102-1 further includes a low frequency antenna element 102A-1 and a high frequency antenna element 102B-1. In alternative embodiments, however, additional antenna elements could be implemented to form a tri-band antenna or a multi-band antenna with three or more antenna elements. In still other embodiments, the antenna is constructed from only a signal antenna element that covers both bands of interest or only a signal band.

In a typical implementation, the low and high frequency antenna elements 102A-1, 102B-1 are electrically small loop antennas. Loop antennas have an inductance that is proportional to the area carved out by the loops. Here, the antenna elements 102A-1, 102B-1 are rectangular. Other shapes such as circular shaped loop antennas known in the art could also be implemented. Electrically small antennas are defined for a particular wavelength lambda (λ) and radius "a" of the sphere enclosing an antenna. Then, if 4πa<λ(4*pi*a is less than lambda), the antenna is considered electrically small. See Wheeler, "Fundamental limitations of Small Antennas, Proceedings of the IRE, Vol. 35, December 1947, pp. 1479-1484.

Generally, the antenna element 102-1 is multiply resonant. This enables the antenna element 102-1 to have optimal performance at a wide range of frequencies and reject interference from other signals that may be in the same band as the desired signal.

In general, smaller antennas are preferable to achieve higher density, yet smaller antennas typically have a lower gain. As a result in other embodiments larger antennas/antenna elements are used, such as antennas/antenna elements with a total length of up to 20 cm, or even up to 50 cm or 100 cm, and possibly even larger understanding that there is a concomitant decrease in packing density.

A resonance of the antenna element 102-1, and each of the other antenna elements 102-2 to 102-*n*, is controlled via a respective tuning feed network 200. The tuning feed network 200 includes a radio frequency (RF) coupling and direct current (DC) injection section 203, a high frequency tuning section 205, and a low frequency tuning section 207. In a typical implementation, the components of the tuning feed network 200 are mounted on the antenna array card (e.g., 152-1 to 152-*n* in FIG. 2) adjacent to the antenna element 102-1.

In the illustrated example, the low frequency tuning section 207 and low frequency antenna element 102A-1 are designed to receive carrier signals in the VHF (Very High Frequency) range or 174 MHz to 216 MHz. The high frequency tuning section 205 and high frequency antenna element 102B-1 are designed to receive carrier signals in the UHF (Ultra High Frequency) range or 470 MHz to 700 MHz.

In a typical implementation, antenna elements (e.g., reference numerals 102-1 to 102-*n* in FIG. 1) are grouped together on an antenna array card (reference numerals 152-1 to 152-*n* in FIG. 2) to form an antenna array (reference numerals 103-1 to 103-*n* in FIG. 2) of antennas. Each antenna element 102-1 to 102-*n* within the antenna array 103 is tuned by a separate tuning feed network 200. Implementing a separate tuning feed network 200 for each antenna 102-1 to 102-*n* enables each antenna to be individually tuned to a different frequency.

Returning to FIG. 3A, a RF connection from the low frequency tuning section 207 to low frequency antenna element 102A-1 is made via capacitors C1 and C3. Capacitors C1 and C3 have a capacitance of 2.2 nanoFarads, in one example, and these capacitors form a DC block (low frequency tuning section DC block 214). A DC block is a frequency filter designed to filter out lower frequency signals and DC signals while allowing higher frequency RF signals to pass. Additionally, the low frequency tuning section DC block 214 prevents the low frequency antenna element 102A-1 from shorting out a tuning voltage sent from the RF coupling and DC injection section 203.

In alternative embodiments, the RF connection is made with band pass filters, high pass filters, diplexers and/or multiplexers.

Capacitors C1 and C3 connect to low frequency tap points 220*a*, 220*b* of the low frequency antenna element 102A-1. The low frequency tap points 220*a*, 220*b* are designed to present the desired impedance from the low frequency antenna element 102A-1 to the feed lines FEED_P, FEED_N. The location of the intersection of the low frequency tap points 220*a*, 220*b* with the low frequency antenna element 102A-1 and the area cut out between the tap structure contribute to the impedance transformation.

Capacitors C2 and C212 are in parallel with the varactor diode pairs D1 and D2. In the illustrated example, capacitor C2 has a capacitance of 15 picoFarads and capacitor C212 has a capacitance of 18 picoFarads. The varactor diodes pairs D1, D2 resonate with the inductance of the low frequency antenna element 102A-1 to set the tuning frequency. The bandwidth is determined by the value of resistor R4 along the parasitic resistances in the wire of the low frequency antenna element 102A-1 and the varactor diode pairs D1 and D2. Resistors R1, R2, and R3 provide high impedance connections for DC tuning voltages that are supplied on the feed line FEED_P to the varactor diode pairs D1 and D2. The high impedance serves two purposes. First, the high impedance provides isolation to the feed lines FEED_P, FEED_N so that RF signal is not lost. Second, the high impedance provides isolation from the varactor diode pairs D1 and D2 so they are not disrupted by other impedance/capacitive effects.

Referring to the high frequency tuning section 205, while there are some differences in the components used and their values, the basic functionality of the circuit is the same as the low frequency tuning section 207. For example, the high frequency antenna element 102B-1 is generally identical to the low frequency antenna element 102A-1 in a current embodiment. Additionally, capacitors C4 and C7 provide an RF connection from the high frequency antenna element 102B-1 to the high frequency tuning section 205. Likewise, capacitors C4 and C7 form a DC block (high frequency tuning section DC block 216). Capacitors C4 and C7 each have a capacitance value of 24 picoFarads (compared to 2.2 nanoFarads for C1 and C3). Resistor R7 and R5 provide a high impedance connection for the tuning voltages provided on feed line FEED_P to varactor diode pair D3. The parasitic resistances in the wire of the high frequency antenna element 102B-1 and the varactor diode pair D3 set the bandwidth. Lastly, high frequency tap points 222a, 222b are designed to present the desired impedance from the high frequency antenna element 102B-1 to the feed lines FEED_P, FEED_N.

The feed lines (FEED_N and FEED_P) connect the high frequency tuning section 205 and the low frequency tuning section 207 to the RF coupling and DC injection section 203. The feed lines (FEED_N, FEED_P) carry the received RF signal from the antenna elements 102A-1, 102B-1, to the RF coupling and DC injection section 203. In a typical implementation, the physical distance from the RF coupling and DC injection section 203 and the antenna elements 102A-1, 102B-1 can be relatively large. For example, in one embodiment the physical distance is twenty or more inches (approximately 0.5 meters). In alternative embodiments, however, the physical distance is only a few inches (e.g., approximately 5 to 8 centimeters).

The tuning feed network further includes an impedance matching circuit 136, which matches the impedance between the RF coupling and DC injection section 203 and the high and low frequency tuning sections (reference numerals 205, 207, respectively). Impedance matching circuits help maximize power transfer and provide an additional means to dynamically tune the antenna element. In the illustrated example, an impedance control line (ICNTL) 137 provides a control signal to adjust the impedance matching circuit. In the illustrated example, the impedance matching circuit 136 is located in the antenna section 111 near the antenna elements.

The RF coupling and DC injection section 203 includes an analog control line (ACNTL) connection 206 and two logical interfaces: DIFF_N 202 coupled with DIFF_P 204. The two logical interfaces DIFF_N 202, DIFF_P 204 are differential radio frequency connections that carry received carrier signals to a receiver (or tuner) and demodulator (reference numerals 104-1 and 106-1 in FIG. 1) that are located on an antenna array card (reference numeral 152 in FIG. 2). The ACNTL connection 206 is a single-ended analog control line that is referenced to ground (e.g., GND-1) and provides the control signal, to tune the varactor diode pairs D1, D2, D3. In the current embodiment, the control signal is a tuning voltage. In the illustrated embodiment, the control signal from the ACNTL connection 206 is generated by the antenna optimization and control system 116. The control signal from the antenna optimization and control system 116 is converted to a voltage by a digital to analog converter 170. A common tuning voltage is provided to the low and high frequency tuning sections 205, 207 and the antenna elements 102A-1, 102B-1.

In an alternative embodiment, the control signal could be a differential control signal. In this embodiment, another input control signal is injected at GND-2 and connected at the end of resistor R6 (GND-2 would be removed/replaced).

Capacitors C5 and C8 are blocking capacitors and form a DC block (RF coupling and DC injection DC block 208). The RF coupling and DC injection DC block 208 provides the ability to superimpose the control signal from ACNTL connection 206 on the same feed line (FEED_P) as the received carrier signals from the low and high frequency antenna elements 102A-1, 102B-1.

Typically, when creating a multi-band antenna, two or more antenna elements are put in parallel. There are several important factors to account for when combining multiple antenna elements. For example, in band (where the antenna is tuned), the impedance as measured at the low frequency tap points 220A, 220B will look like a single pole bandpass (complex pole-pair) filter having a desired impedance at the resonant frequency. Below the tuned frequency, the impedance will look like a short circuit. Above the tuned frequency, the impedance will approach an open circuit. When implementing the low frequency tuning section DC block 214, the low frequency tuning section 207 approaches an open circuit at higher frequencies.

Because the low frequency antenna element 102A-1 looks like an open circuit when the tuning feed network 200 is operating at higher frequencies, the low frequency tuning section 207 is typically able to connect to the high frequency tuning section 205 without issue. However, the high frequency antenna element 102B-1 looks like a short circuit when the tuning feed network 200 is operating at lower frequencies. To protect the low frequency antenna element 102A-1 when operating at lower frequencies, high frequency tuning section DC block 216 is used to electrically open the high frequency antenna element 102B-1.

In alternative embodiments, different capacitors values used for the high frequency tuning section DC block 216. In the illustrated example, the 24 picoFarad capacitor is selected. Similar design considerations are applied when combining additional antennas elements to create tri-band or multi-band antenna elements with, for example, three or more loop antennas.

Figure 3B:
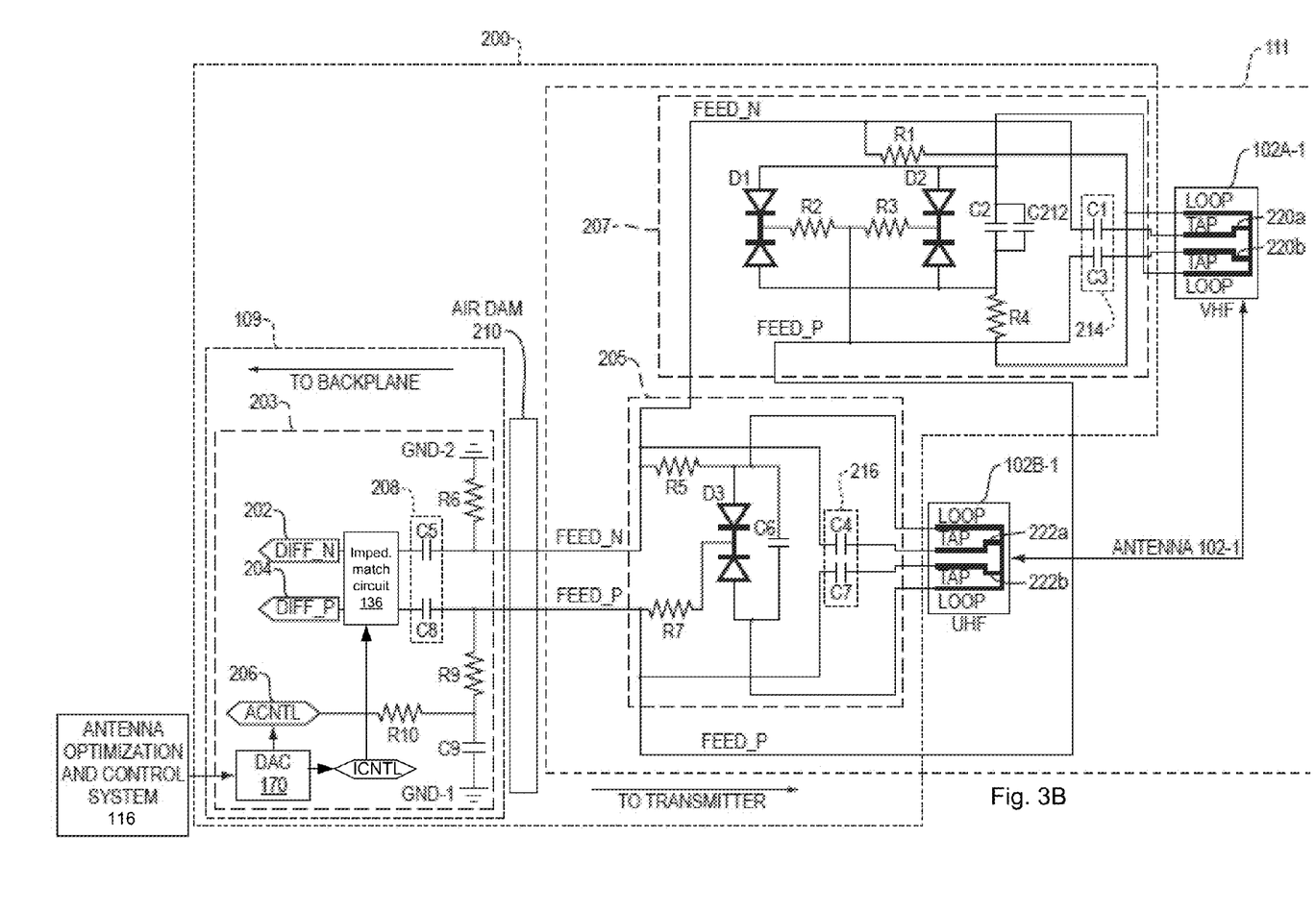
FIG. 3B is an alternative embodiment of the circuit diagram and tuning feed network for the antenna system.

FIG. 3B is an alternative embodiment of the tuning feed network 200 for the antenna system 100.

The illustrated example is nearly identical to the circuit diagram of FIG. 3A. In the illustrated example, however, the impedance matching circuit 136 is located between the DIFF_N 202 and DIFF_P 204 inputs and the RF coupling and DC injection DC block 208 (e.g., capacitors C5 and C8). Additionally, the impedance matching circuit 136 is located in the tuner and demodulator section 109.

Figure 4:
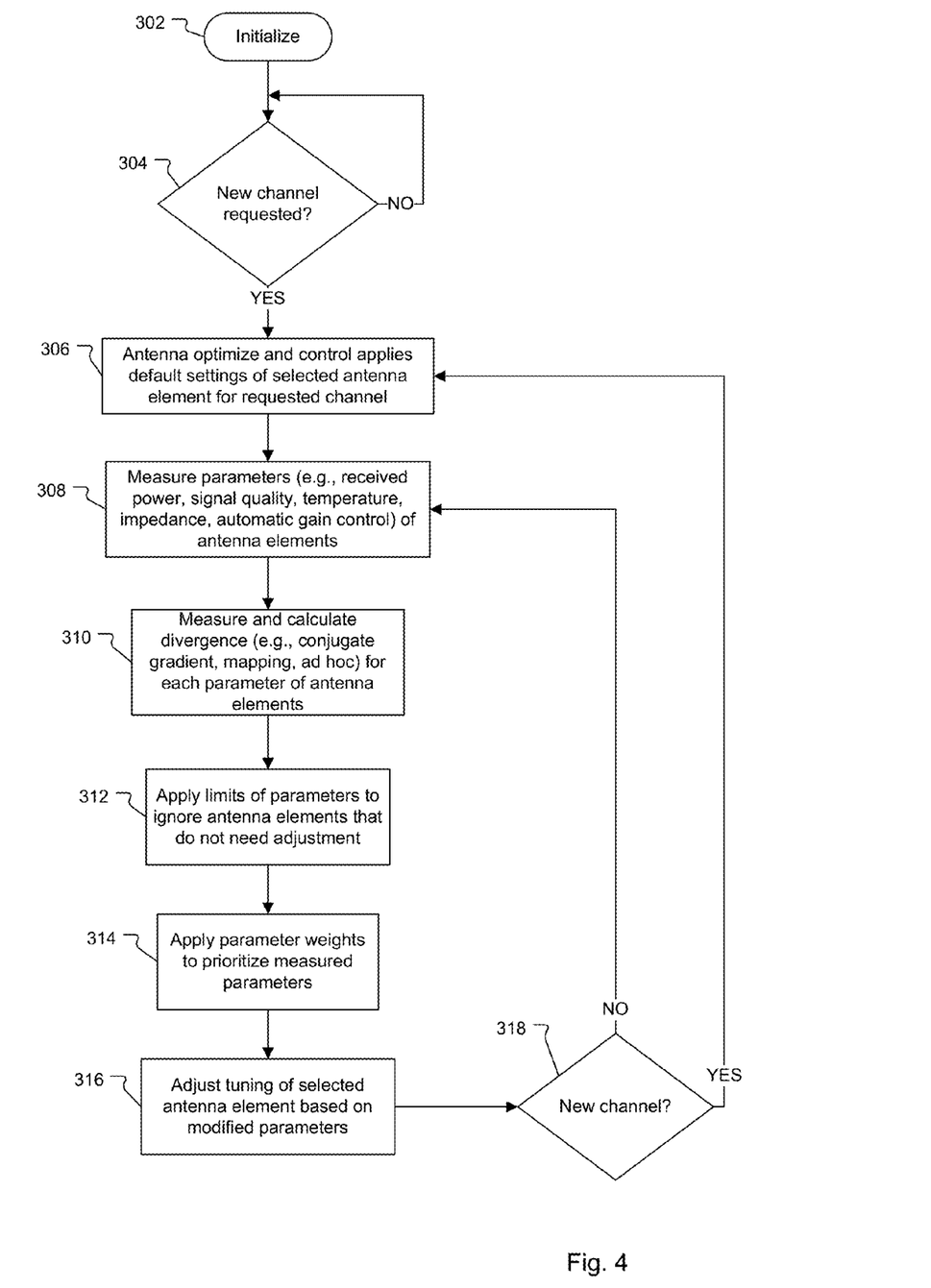
FIG. 4 is a flowchart illustrating the steps the antenna optimize and control system performs to dynamically tune a single antenna element.

FIG. 4 is a flowchart illustrating the steps the antenna optimize and control system 116 performs to dynamically tune an antenna element. In the illustrated example, the antenna optimize and control system 116 has no prior information about the antenna elements within the array.

In the first step 304, the antenna optimize and control system 116 determines if a new channel is requested by a user. If a new channel is not requested by the user, then the antenna optimize and control system 116 waits until a new channel is requested.

If a new channel is requested by the user, then the antenna optimize and control system 116 selects an optimized antenna element and applies default settings of the selected antenna element for the requested channel in step 306. In the next step 308, the antenna optimize and control system 116 measures parameters of the antenna elements. In a preferred embodiment, the measured parameters include received power of the antenna element, signal quality of the antenna element, temperature of the antenna element, impedance of the antenna element, and/or automatic gain control level, to list a few examples.

In the next step 310, the antenna optimize and control system 116 calculates a divergence for each measured parameter. The divergence is calculated to provide a vector derivative based on coupling of all antenna elements. In a typical implementation, the divergence is calculated via a conjugate gradient, mapping techniques, or using ad hoc optimization algorithms. Alternative implementations may implement other methods to calculate the divergence, which are known in the art.

Next, in step 312, the antenna optimize and control system 116 applies limits for the parameters. This is done so that antenna elements that do not need to be adjusted are ignored. In a typical implementation, the users are selectively assigned antenna elements throughout the array to minimize coupling between adjacent antenna elements. Thus, in some scenarios, the antenna elements will not need to be adjusted (even though they could be adjusted) because the antenna elements are able to adequately receive the requested channel using the default tuning parameters. That is, the additional tuning of the antenna element would only provide a minimal (or negligible) increase in the quality of the received signal.

In the next step 314, the antenna optimize and control system 116 applies parameter weights to prioritize the measured parameters. Each parameter measured in the tuning process is multiplied by a pre-defined constant (weight). An increased weight will increase the impact a parameter has on the tuning algorithm. A smaller weight will cause a parameter to have less impact on the tuning algorithm. A weight of zero will eliminate the impact of a parameter. Thus, parameters with higher weights have higher impact and higher priority.

In the next step 316, the antenna optimize and control system 116 adjusts the tuning of the selected antenna element based on the modified parameters.

In the next step 318, the antenna optimize and control system 116 determines if a new channel is requested by a user. If a new channel is not requested by the user, then the antenna optimize and control system 116 returns to step 308 to measure parameters of the antenna elements. If a new channel is requested by the user, then the antenna optimize and control system 116 returns to step 306 to apply default settings of the newly requested channel.

Figure 5:
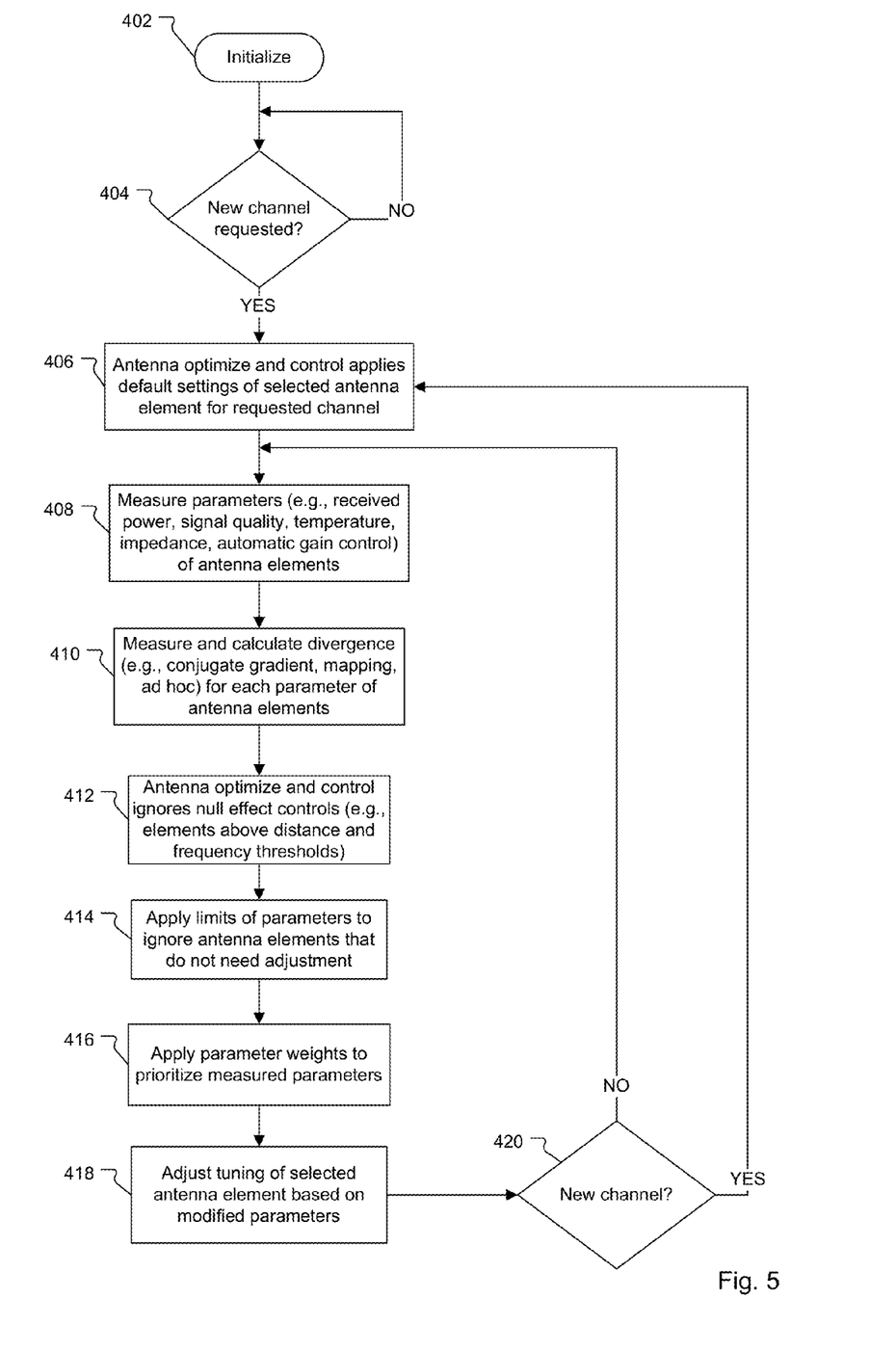
FIG. 5 is a flowchart illustrating the steps the antenna optimize and control system performs to dynamically tune antenna elements where there is no a priori knowledge of the antenna elements.

FIG. 5 is a flowchart illustrating the steps the antenna optimize and control system 116 performs to dynamically tune antenna elements 102-1 to 102-n. In this embodiment, there is no prior information about the measured parameters of the antenna elements 102-1 to 102-n.

In general, because there is no prior knowledge about the measured parameters, information about all the antennas must be measured before elements can be adjusted. This is because any adjustment to one antenna element can affect other antenna elements within the array. By measuring all the parameters of all the antenna elements first, the antenna elements are tuned with respect to the other antennas.

In the illustrated example, steps 402-410 are identical to steps 302-310 of FIG. 4.

In the next step 412, the antenna optimize and control system 116 ignores null effect controls from other antenna elements (i.e., not the selected antenna element). In a preferred embodiment, the null effect controls are antenna elements, which are not close in physical distance or tuned frequency to cause interference (e.g., coupling) with the selected antenna. In a typical implementation, the antenna optimize and control system 116 includes predefined frequency and distance thresholds. If the other antenna elements exceed the thresholds, then the antenna optimize and control system 116 ignores the measured parameters from these antenna elements. In a preferred embodiment, the frequency threshold is one channel higher or lower than the channel of the selected antenna element. In a preferred embodiment, the distance threshold is the physical distance between antennas such that the coupling while on the same channel is less than or equal to −20 decibels.

Lastly, in the illustrated example, steps 414 to 420 are identical to steps 312-318 of FIG. 4.

Figure 6:
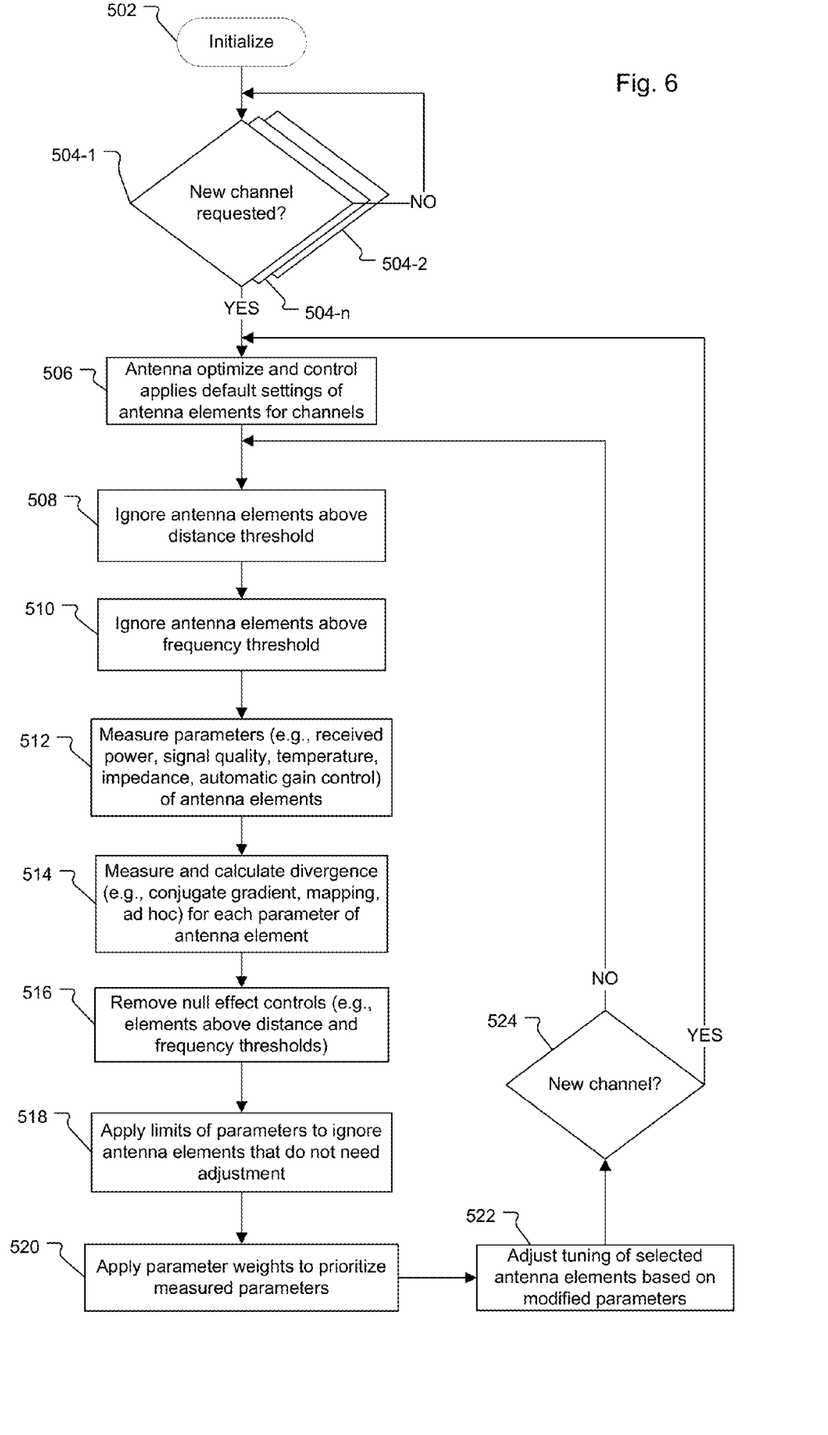
FIG. 6 is a flowchart illustrating the steps the antenna optimize and control system performs to dynamically tune antenna elements where there is prior knowledge of the antenna elements in the array.

FIG. 6 is a flowchart illustrating the steps the antenna optimize and control system 116 performs to dynamically tune antenna elements. In this embodiment, there is prior knowledge of the parameters of the antenna elements.

Steps 502-506 are nearly identical to steps 302-310 of FIG. 4. In the illustrated example, multiple threads (i.e., independent sequences) are created for each new channel requested by individual users (shown as steps 504-1 to 504-n).

The prior knowledge of the antenna elements enables the antenna optimize and control system 116 to ignore antenna elements above predefined distance and frequency thresholds in steps 508 and 510, respectively.

In the next step 512, the antenna optimize and control system 116 measures parameters of the antenna elements. In the next step, 514, the antenna optimize and control system 116 measures parameters and calculates the divergence for the parameters of the antenna elements.

In the next step 516, the antenna optimize and control system 116 removes null effect controls to further ignore antenna elements that will not have an effect on the selected antenna. Even though some antenna elements were ignored in steps 508 and 510, the antenna optimize and control system 116 ignores additional antennas elements in step 516 because new users are being assigned antennas, current users are stopping their service (i.e., discontinuing use of assigned antennas), and current users are also changing channels.

Lastly, in the illustrated example, steps 518 to 524 are identical to steps 312-328 of FIG. 3.

Figure 7:
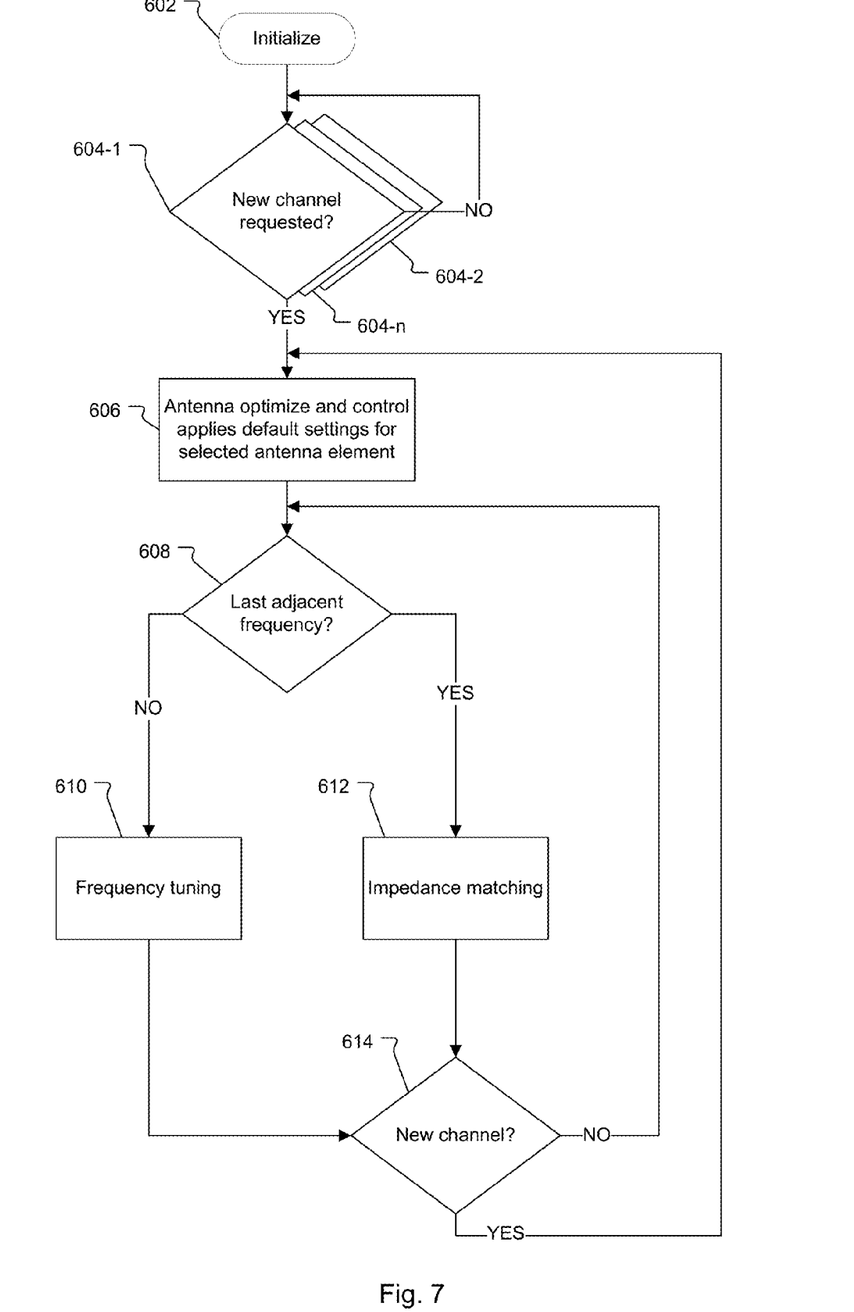
FIG. 7 is a flowchart illustrating the steps the antenna optimize and control system performs to dynamically tune antenna elements with frequency tuning and impedance matching.

FIG. 7 is a flowchart illustrating the steps the antenna optimize and control system 116 performs to dynamically tune antenna elements with frequency tuning and impedance matching.

Similar to step 504-1 to 504-n in FIG. 6, multiple threads 604-1 to 604-n are created for each new channel requested by different users. In the first step 604, the antenna optimize and control system 116 determines if a new channel is requested by a user.

If a new channel is not requested by the user, then the antenna optimize and control system 116 waits until a new channel is requested. If a new channel is requested, then, the antenna optimize and control system 116 applies default settings for the elected antenna element for the requested channel in step 606.

In the next step 608, the antenna optimize and control system 116 determines if the last adjacent frequency has been adjusted. If the last adjacent frequency has not been adjusted, then the antenna optimize and control system 116 performs frequency tuning (e.g., FIGS. 4-6) for the antenna elements in step 610.

If the last adjacent frequency has been adjusted, then the antenna optimize and control system 116 performs impedance matching for the antenna elements in step 612. In a typical implementation, the impedance matching is performed by the impedance matching circuit (e.g., reference numeral 136 in FIGS. 3A-3B).

In the next step 614, the antenna optimize and control system 116 determines if a new channel is requested. If a new channel is not requested, then the antenna optimize and control system 116 returns to step 608. If a new channel is requested, then the antenna optimize and control system 116 applies defaults settings of the selected antenna element for the requested channel in step 606.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for dynamically tuning antenna elements, the method comprising:
    receiving requests to capture over the air broadcasts;
    selecting an antenna element from a group of available antenna elements to capture the requested over the air broadcasts;
    applying default settings to tune the antenna element to capture the requested over the air broadcasts; and
    dynamically tuning the selected antenna element to enhance reception of the over the air broadcasts away from the default settings; and
    applying parameter limits to prevent dynamically tuning antenna elements above a frequency threshold.

2. The method of claim 1, further comprising measuring parameters of the selected antenna element to determine how to optimize the selected antenna element.

3. The method of claim 2, wherein the parameters include received power, signal quality, temperature of the antenna element, and/or automatic gain control.

4. The method according to claim 3, further comprising prioritizing the measured parameters.

5. The method according to claim 4, further comprising adjusting a control voltage of a varactor diode pair based on the measured parameters to tune the selected antenna element.

6. The method according to claim 2, further comprising using an optimization algorithm to yield a divergence of the measured parameters.

7. The method according to claim 6, wherein the optimization algorithm includes conjugate gradient algorithm, mapping techniques, or ad hoc algorithm.

8. The method according to claim 1, further comprising matching impedances between the antenna elements and tuners with impedance matching circuits.

9. The method according to claim 1, further comprising applying parameter limits to prevent dynamically tuning antenna elements above a distance threshold.

10. An antenna element tuning system, comprising:
    a web server that receives requests to capture over the air broadcasts from broadcasting entities; and
    an antenna controller that selects an antenna element from a group of available antenna elements to capture the requested over the air broadcasts, applies default settings to tune the antenna element to capture the requested over the air broadcasts, then dynamically tunes the antenna element to enhance reception of the over the air broadcasts away from the default settings; and applies parameter limits to prevent dynamically tuning antenna elements above a frequency threshold.

11. The system of claim 10, wherein parameters of the selected antenna element are measured to determine how to optimize the selected antenna element.

12. The system of claim 11, wherein the parameters include received power, signal quality, temperature of the antenna element, and automatic gain control.

13. The system according to claim 12, wherein the antenna server prioritizes the measured parameters.

14. The system according to claim 13, further comprising a varactor diode pair that is adjusted to tune the selected antenna element based on the measured parameters.

15. The system according to claim 10, wherein calculating an optimization algorithm yields a divergence of measured parameters.

16. The system according to claim 15, wherein the optimization algorithm includes conjugate gradient, mapping techniques, or ad hoc.

17. The system according to claim 10, further comprising an impedance matching circuit that matches the impedance of the antenna elements with tuners.

18. The system according to claim 10, wherein the antenna controller applies parameter limits to prevent dynamically tuning antenna elements above a distance threshold.

* * * * *